United States Patent
Otsuka et al.

(10) Patent No.: US 6,447,576 B1
(45) Date of Patent: Sep. 10, 2002

(54) CLEANING AGENT AND CLEANING PROCESS OF HARMFUL GAS

(75) Inventors: Kenji Otsuka; Yutaka Amijima; Ryuji Hasemi; Youji Nawa, all of Kanagawa-ken (JP)

(73) Assignee: Japan Pionics Co., Ltd., Tokyo (JP)

( * ) Notice: Subject to any disclaimer, the term of this patent is extended or adjusted under 35 U.S.C. 154(b) by 63 days.

(21) Appl. No.: 09/671,139

(22) Filed: Sep. 28, 2000

(30) Foreign Application Priority Data

Oct. 29, 1999 (JP) .......................................... 11-308472

(51) Int. Cl.$^7$ ............................................... B01D 53/02
(52) U.S. Cl. ........................... 95/116; 95/133; 95/141; 95/143; 96/153; 423/245.1; 502/244; 502/345
(58) Field of Search .............................. 95/90, 116, 133, 95/141, 143, 900, 902; 96/108, 153; 423/245.1; 502/244, 345

(56) References Cited

U.S. PATENT DOCUMENTS

| | | | |
|---|---|---|---|
| 4,535,072 A | * | 8/1985 | Kitayama et al. |
| 4,784,837 A | * | 11/1988 | Kitayama et al. |
| 4,996,030 A | * | 2/1991 | Kitahara et al. |
| 5,470,555 A | * | 11/1995 | Shimada et al. |
| 5,482,536 A | * | 1/1996 | Ngai et al. |
| 5,512,262 A | * | 4/1996 | Shimada et al. |
| 5,632,964 A | * | 5/1997 | Ishii et al. |
| 5,853,678 A | * | 12/1998 | Sugimori et al. |
| 6,284,209 B1 | * | 9/2001 | Harada et al. |

FOREIGN PATENT DOCUMENTS

| | | |
|---|---|---|
| JP | 2-145422 | 6/1990 |
| JP | 7-60054 | 3/1995 |
| JP | 7-68128 | 3/1995 |

* cited by examiner

Primary Examiner—Duane S. Smith
(74) Attorney, Agent, or Firm—Oblon, Spivak, McClelland, Maier & Neustadt, P.C.

(57) ABSTRACT

A cleaning agent and a cleaning process for cleaning a harmful gas containing, as a harmful component, an organometallic compound represented by the general formula:

$$R_m—M—H_n$$

wherein R is alkyl; M is As, P, S, Se or Te; and m and n are each positive integer satisfying the relation: m+n=valence of M are described. The cleaning agent contains, as an effective component, copper (II) oxide or a mixture of copper (II) oxide and manganese dioxide. The copper (II) oxide has a BET specific surface area of 10 m$^2$/g or greater which is extremely larger than that of copper (II) oxide conventionally used as the effective component of known cleaning agents. With such an extremely large BET specific surface area, the cleaning agent strongly and stably adsorbs the harmful organometallic compound, thereby efficiently cleaning the harmful gas without causing desorption of the adsorbed organometallic compound.

14 Claims, No Drawings

CLEANING AGENT AND CLEANING PROCESS OF HARMFUL GAS

BACKGROUND OF THE INVENTION

1. Field of the Invention

The present invention relates to a cleaning agent and a cleaning process for cleaning a harmful gas containing a harmful organometallic compound represented by the general formula:

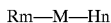

Rm—M—Hn wherein R is alkyl, M is As, P, S, Se or Te, and m and n are each positive integer satisfying the relation: m+n=valence of M. More particularly, the invention relates to a cleaning agent and a cleaning process for cleaning a harmful gas from MOCVD (metal organic chemical vapor deposition) process or other CVD processes in the production of semiconductors.

2. Description of the Prior Art

The recent development in semiconductor industries promotes the high integration and miniaturization of semiconductor devices. This brought about an increased use of organometallic compound gases such as t-butylarsine, t-butylphosphine, t-butylthiol, isopropylarsine and isopropylphosphine in place of arsine hydride gas, phosphine hydride gas, etc. which have been conventionally used. The use of such organometallic compound gases as a feed gas, a doping gas or a gas for forming thin metal films comes to be essential particularly in CVD process.

However, many of these organometallic compounds represented by the general formula:

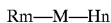

Rm—M—Hn wherein R, M, m and n are as defined above (hereinafter may be referred to merely as "alkylmetal hydride") are highly toxic or doubtful about their safety, and most thereof are highly flammable. Therefore, these alkylmetal hydrides have been required to be removed from an exhaust gas prior to its discharge into atmosphere.

Known cleaning process for harmful gases containing an alkylmetal hydride includes a wet process in which the harmful gases is absorbed and decomposed by a scrubber, and a dry process using a porous adsorbent such as activated carbon and inorganic compounds. In the wet process, since the alkylmetal hydrides are not soluble in water, no effective absorbing solution has been proposed. In the dry process, since the adsorption on activated carbon is a physical process, the desorption of the adsorbed gas is likely to occur. In view of these circumstances, the inventors have proposed various cleaning agents and cleaning processes for cleaning a harmful gas containing an alkylmetal hydride in dry process.

For instance, Japanese Patent Application Laid-Open No. 7-68128 proposes a process of cleaning a harmful gas containing a harmful alkylmetal hydride of arsenic, phosphorus, sulfur, serene or tellurium by contacting the harmful gas with a cleaning agent comprising a metal oxide, which is mainly composed of copper (II) oxide and manganese dioxide, incorporated with an alkali metal compound. Japanese Patent Application Laid-Open No. 7-60054 proposes a process of cleaning a harmful gas containing the alkylmetal hydride by contacting the harmful gas with a cleaning agent comprising a metal oxide, which is mainly composed of copper (II) oxide and manganese dioxide, incorporated with a cobalt (II) compound.

The above known cleaning processes have been developed for the purpose of attaining a high cleaning efficiency (removed amount of alkylmetal hydride per unit amount of cleaning agent) in the cleaning of a harmful gas containing the alkylmetal hydride by a cleaning agent basically made of a two-component system of copper (II) oxide and manganese dioxide. In the process of cleaning the harmful gas, a hopcalite catalyst has been used as the metal oxide mainly composed of copper (II) oxide and manganese dioxide due to its easy availability. However, since the alkylmetal hydride-containing harmful gas from semiconductor manufacturing process usually contains hydrogen, the cleaning agent which is substantially the two-component system of copper (II) oxide and manganese dioxide is liable to be reduced by hydrogen, thereby making the cleaning agent ineffective. Therefore, to make the cleaning agent resistant to reduction, it has been proposed to add another component to the two-component system of copper (II) oxide and manganese dioxide.

In the process using a cleaning agent comprising a metal oxide mainly composed of copper (II) oxide and manganese dioxide added with an alkali metal compound, it is intended to inhibit the reduction of the cleaning agent by incorporating the alkali metal compound. However, this process in turn fails to attain a satisfactory cleaning efficiency. In the process using a cleaning agent comprising a metal oxide mainly composed of copper (II) oxide and manganese dioxide added with a cobalt (II) compound, a high cleaning efficiency can be attained since the cobalt (II) compound not only acts as an inhibitor against the reduction by hydrogen but also reacts with the alkylmetal hydride to form a complex. However, it has been found that the alkylmetal hydride once adsorbed on the cleaning agent is desorbed when allowed to stand for a long time because the complex is unstable.

Accordingly, an object of the present invention is to provide a cleaning agent and a cleaning process for cleaning a harmful gas containing an organometallic compound represented by the general formula: Rm—M—Hn wherein R, M, m and n are as defined above, which are excellent in the cleaning efficiency and free from desorption of the organometallic compounds adsorbed on the cleaning agent.

SUMMARY OF THE INVENTION

As a result of extensive research in view of the above object, the inventors have found that a one-component cleaning agent containing, as the main component, copper (II) oxide having a BET specific surface area of 10 m$^2$/g or greater or a two-component cleaning agent containing, as the main component, 0.3 part by weight or less of manganese dioxide having a BET specific surface area of 130 m$^2$/g or greater per 1 part by weight of copper (II) oxide having a BET specific surface area of 10 m$^2$/g or greater show a high cleaning efficiency without causing reduction by hydrogen and desorption of the harmful components adsorbed on the cleaning agent, in the face of art recognition that a one-component agent containing only copper (II) oxide having a relatively small specific surface area generally employed in the known cleaning agents, and a two-component mixture containing copper (II) oxide and manganese dioxide each having a relatively small specific surface area are ineffective as the cleaning agent due to their low cleaning efficiency. The present invention has been accomplished on the basis of this finding.

Thus, in a first aspect, the present invention provides a cleaning agent for cleaning a harmful gas containing, as a harmful component, an organometallic compound represented by the general formula:

Rm—M—Hn wherein R is alkyl; M is As, P, S, Se or Te; and m and n are each positive integer satisfying the relation: m+n=valence of M, the cleaning agent comprising, as an effective component, copper (II) oxide having a BET specific surface area of 10 m²/g or greater.

In a second aspect of the present invention, there is provided a cleaning agent for cleaning a harmful gas containing, as a harmful component, an organometallic compound represented by the general formula:

Rm—M—Hn wherein R is alkyl; M is As, P, S, Se or Te; and m and n are each positive integer satisfying the relation: m+n=valence of M, the cleaning agent comprising, as effective components, 0.3 part by weight or less of manganese dioxide having a BET specific surface area of 130 m²/g or greater per 1 part by weight of copper (II) oxide having a BET specific surface area of 10 m²/g or great.

In a third aspect of the present invention, there is provided a process for cleaning a harmful gas containing, as a harmful component, an organometallic compound represented by the general formula:

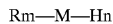

Rm—M—Hn wherein R is alkyl; M is As, P, S, Se or Te; and m and n are each positive integer satisfying the relation: m+n=valence of M, the process comprising:

contacting the harmful gas with a cleaning agent comprising, as an effective component, copper (II) oxide having a BET specific surface area of 10 m²/g or greater.

In a fourth aspect of the present invention, there is provided a process for cleaning a harmful gas containing, as a harmful component, an organometallic compound represented by the general formula:

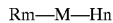

Rm—M—Hn wherein R is alkyl; M is As, P, S, Se or Te; and m and n are each positive integer satisfying the relation: m+n=valence of M, the process comprising:

contacting the harmful gas with a cleaning agent comprising, as effective components, 0.3 part by weight or less of manganese dioxide having a BET specific surface area of 130 m²/g or greater per 1 part by weight of copper (II) oxide having a BET specific surface area of 10 m²/g or greater.

DETAILED DESCRIPTION OF THE INVENTION

The cleaning agent and the cleaning process according to the present invention are used in cleaning a harmful gas comprising nitrogen, argon, helium or hydrogen gas containing a harmful alkylmetal hydride represented by the formula:

Rm—M—Hn wherein R is alkyl, M is As, P, S, Se or Te, and m and n are each positive integer satisfying the relation: m+n=valence of M. The cleaning agent according to the present invention contains as an effective component, copper (II) oxide having a BET specific surface area of 10 m²/g or greater, or contains as effective components, 1 part by weight of copper (II) oxide having a BET specific surface area of 10 m²/g or greater and 0.3 part by weight or less of manganese dioxide having a BET specific surface area of 130 m²/g or greater. The cleaning process of the present invention comprises a step of contacting the harmful gas with one of these cleaning agents.

By using the cleaning agent and the cleaning process of the present invention, a large amount of the harmful gas is rapidly removed even at ordinary temperature. For instance, the cleaning agent and the cleaning process of the present invention show excellent effects in rapidly cleaning an exhaust gas from semiconductor manufacturing process or air contaminated with harmful substances leaked from tanks.

In the formula, Rm—M—Hn, R is alkyl, preferably straight or branched alkyl having 3 to 5 carbon atoms, and more preferably isopropyl and t-butyl. M is As, P, S, Se or Te. The suffix "m" and "n" are each positive integer satisfying the relation: m+n=valence of M. Preferably, "m" is 1. Examples of the alkylmetal hydride include t-butylarsine (t-$C_4H_9AsH_2$), isopropylarsine (i-$C_3H_7AsH_2$), t-butylphosphine (t-$C_4H_9PH_2$), isopropylphosphine (i-$C_3H_7PH_2$), t-butylthiol (t-$C_4H_9SH$), isopropylthiol (i-$C_3H_7SH$), t-butylselenol (t-$C_4H_9SeH$), isopropylselenol (i-$C_3H_7SeH$), t-butyltellurol (t-$C_4H_9$the), isopropyltellurol (i-$C_3H_7$the), etc.

The copper (II) oxide used in the cleaning agent of the present invention has a BET specific area of 10 m²/g or greater, preferably 50 to 150 m²/g (hereinafter may be referred to merely as "high-specific surface area copper (II) oxide"). The use of copper (II) oxide having a BET specific surface area of less than 10 m²/g fails to achieve a high cleaning efficiency. Copper (II) oxide having a BET specific surface area of more than 150 m²/g is also usable in the present invention, but the production of copper (II) oxide with such a high BET specific surface area is limited due to its difficulty of filtration and rinse in the production process.

With such a large BET specific surface area of copper (II) oxide, the cleaning agent of the present invention form a stable compound with the alkylmetal hydrides, thereby effectively preventing the desorption of the adsorbed alkylmetal hydrides from the cleaning agent. In addition, with such a large BET specific surface area, a high cleaning efficiency can be attained without needing the use of the alkali metal compound and the cobalt (II) compound which have been used in the prior art to enhance the cleaning efficiency of known oxide-based cleaning agents. However, it should be noted that the present invention does not preclude the incorporation of the alkali metal compound and the cobalt (II) compound.

The high-specific surface area copper (II) oxide may be produced by known methods, for example, by adding an ammonium salt as a neutralizing agent to an aqueous solution of high-purity copper nitrate to precipitate fine particles, and water-washing, drying and then calcining the fine particles (Japanese Patent Application Laid-Open No. 2-145422).

The manganese dioxide used in the cleaning agent of the present invention has a BET specific surface area of 130 m²/g or greater, preferably 175 m²/g or greater (hereinafter may be referred to merely as "high-specific surface area manganese dioxide"). The upper limit of the BET specific surface area is about 400 m²/g due to the production limit. The use of manganese dioxide having a BET specific surface area of less than 130 m²/g is ineffective in further improving the cleaning efficiency. The high-specific surface area manganese dioxide may be produced by known methods, for example, by mixing a dilute aqueous potassium permanganate solution and a dilute aqueous manganese sulfate solution together with concentrated sulfuric acid with heating under stirring, and then washing and drying the obtained precipitate.

The cleaning agent of the present invention includes one-component cleaning agent containing, as an effective component, the high-specific surface area copper (II) oxide, and a two-component cleaning agent containing, as effective components, the high-specific area copper (II) oxide and the high-specific surface area manganese dioxide. In the two-component cleaning agent, the mixing ratio of the effective components is usually 0.3 part by weight or less, preferably 0.05 to 0.2 part by weight of the high-specific surface area manganese dioxide per 1 part by weight of the high-specific surface area copper (II) oxide. When the mixing ratio is higher than 0.3 part by weight of the high-specific surface area manganese dioxide per 1 part by weight of the high-specific surface area copper (II) oxide, the undesired reduction of the cleaning agent by hydrogen occurs.

To enhance the moldability and the strength of the shaped cleaning agent, it is preferred to use a binder to prepare the cleaning agent. Examples of the binder include an organic binder such as polyvinyl alcohol, polyethylene glycol, polypropylene glycol, methylcellulose, hydroxypropylmethylcellulose and carboxymethylcellulose, and an inorganic binder such as silica, alumina, diatomaceous earth, sodium silicate and sodium hydrogensulfate.

In the preparation of the cleaning agent, the binder may be added to and kneaded with any of the high-specific surface area copper (II) oxide alone, the high-specific surface area manganese dioxide alone and a mixture thereof. The addition amount of the binder varies depending upon the contents of respective components, molding conditions or the like, and therefore, is not particularly restricted. However, the addition of an excessively large amount reduces the cleaning efficiency. Therefore, the amount of the binder added is preferably 10% by weight or less, more preferably 5% by weight or less based on the total weight of the cleaning agent.

Also, the cleaning agent may contain impurities or inactive substances unless the presence thereof adversely affects its cleaning efficiency. Although the cleaning agent exhibits a more excellent cleaning efficiency in a dry state, the cleaning agent may contain water in an amount of 15% by weight or less based on the total weight of the cleaning agent. Irrespective of the presence of the binder, impurities, inactive substances, water or the like, the content of the effective component or the effective components is preferably 75% by weight or more, more preferably 90% by weight or more based on the total weight of the cleaning agent.

The size and shape of the cleaning agent according to the present invention are not specifically limited. For example, the cleaning agent may be formed into a spherical shape, a cylindrical shape, a tubular shape, a granular shape or the like. The spherical cleaning agent may have a diameter of about 0.5 to 10 mm. The cylindrical, e.g., pellet-like or tablet-like cleaning agent may have a diameter of about 0.5 to 10 mm and a height of about 2 to 20 mm. The granular or irregularly shaped cleaning agent may have a size of about 0.84 to 5.66 mm in terms of mesh size. The packing density of the cleaning agent when packed into a cleaning column varies depending upon its shape and production method, and is preferably about 0.4 to 2.0 g/ml.

The cleaning agent is usually packed in a cleaning column and used as a fixed bed. However, the cleaning agent may also be used in the form of a moving bed or a fluidized bed. In general, the harmful gas containing the alkylmetal hydride is allowed to pass through a cleaning column filled with the cleaning agent and brought into contact with the cleaning agent, thereby cleaning the harmful gas by removing the harmful alkylmetal hydride. The cleaning process of the present invention does not require heating and cooling, so that the contact temperature between the cleaning agent and a gas to be treated is 100° C. or less, preferably around room temperature (10 to 50° C.). Although the temperature sometimes rises by 10 to 40° C. due to the reaction heat generated after starting the cleaning process, there is no fear of causing excessive heat generation during the cleaning process.

The pressure of the cleaning process is not particularly restricted. The cleaning process may be usually carried out under ordinary pressure, and also under reduced pressure or under a pressure of about 0.1 MPaG.

The gas to be treated by the present invention may include nitrogen, argon, helium, hydrogen or the like containing the harmful alkylmetal hydride, and may be in dry state or in highly wet state to such an extent as to cause no moisture condensation.

The concentration of the alkylmetal hydride in the gas and the flow rate of the gas to be treated by the process of the present invention are not particularly restricted. In general, the flow rate is decreased with increasing concentration. The concentration of the alkylmetal hydride is usually 1% or less. However, a harmful gas containing the alkylmetal hydride in a higher concentration can be treated by the cleaning process of the present invention by reducing the flow rate.

The cleaning column is appropriately designed according to the amount of the gas to be treated and the concentration of the alkylmetal hydride, and preferably designed such that the superficial linear velocity (LV) is 0.5 to 50 cm/sec for a relatively low concentration of lower than 0.1%; 0.05 to 20 cm/sec for a concentration of about 0.1 to 1%; and 10 cm/sec or less for a relatively high concentration of higher than 1%.

The present invention will be described in more detail by reference to the following examples. However, it should be noted that the following examples are illustrative and not intended to limit the invention thereto.

(A) Preparation of Copper (II) Oxide

Three kinds of copper (II) oxides having different BET specific surface areas were prepared as shown below.

(A-1) Preparation of Copper (II) Oxide Having a BET Specific Surface Area of 80 $m^2/g$ A solution of 95.3 g of copper dissolved in 2905 g of nitric acid was added to an aqueous solution of 120 g of sodium hydroxide dissolved in 2880 g of water at room temperature over 10 minutes. The precipitates formed were stirred for three hours at room temperature, and then separated by filtration, washed three times with 6 kg of ion-exchanged water and filtered again to obtain a cake of copper hydroxide, which was then dried at 80° C. for 12 hours and calcined at 380° C. for three hours to obtain powdery copper (II) oxide. The BET specific surface area of the powdery copper (II) oxide measured by a gas adsorption measuring device "AUTOSORB 3B" (manufactured by YUASA IONICS Co., Ltd.) was 80 $m^2/g$.

(A-2) Preparation of Other Copper (II) Oxides

In the same manner as in the preparation of copper (II) oxide having a BET specific surface area of 80 $m^2/g$ except for changing the calcining conditions to 450° C. for 5 hours or 600° C. for 5 hours, two kinds of copper (II) oxides having respective BET specific surface areas of 50 $m^2/g$ and 15 $m^2/g$ were prepared.

(B) Preparation of Manganese Dioxide

Four kinds of manganese dioxides having different BET specific surface areas were prepared as follows.

(B-1) Preparation of Manganese Dioxide Having a BET Specific Surface Area of 243 m²/g Into an aqueous solution of 398 g of potassium permanganate in 12.5 kg of water, a mixture of 8.46 kg of a 3-wt. % manganese sulfate aqueous solution and 144 g of concentrated sulfuric acid was rapidly poured at 70° C. to carry out the reaction. After stirring the reaction mixture containing precipitate at 90° C. for 3 hours, the precipitate was collected by filtration, washing with three portions of 25 kg ion-exchanged water and further filtration, thereby obtaining 1,200 g of manganese dioxide cake. The resultant manganese dioxide cake was dried at 90° C. for 12 hours to obtain 350 g of powdery manganese dioxide. The BET specific surface area of the powdery manganese dioxide measured by a gas adsorption measuring device "AUTOSORB 3B" (manufactured by YUASA IONICS Co., Ltd.) was 243 m²/g.

(B-2) Preparation of Other Manganese Dioxides

The same procedures as in the preparation process (B-1) were repeated except for changing the amount of water for the aqueous solution of potassium permanganate, the concentration and amount of the aqueous solution of manganese sulfate, and the amount of ion-exchanged water, thereby obtaining three types of manganese dioxides having respective BET specific surface areas of 182 m²/g, 138 m²/g and 123 m²/g.

(C) Cleaning Test

EXAMPLE 1

A mixture of 100 g of powdery copper (II) oxide having a BET specific surface area of 80 m²/g and 0.5 g of hydroxypropylmethylcellulose as a binder was kneaded uniformly to form a cake, which was then extruded from an extrusion molding machine to produce a strand having a diameter of 1.8 mm. The strand was cut into pellets having a length of about 5 to 10 mm, and then dried at 90° C. for 12 hours to obtain a cleaning agent (A) (moisture content: 1.0 wt. %).

The cleaning agent (A) (100 ml) was packed in a quartz cleaning column having an inner diameter of 20 mm, through which a dry nitrogen gas containing 3,000 ppm of t-butylphosphine as a harmful component was passed at 20° C. and a flow rate of 349 ml/min (superficial linear velocity of 1.85 cm/sec) under ordinary pressure. A portion of the effluent gas from the outlet of the cleaning column was sampled, and the time (effective treating time) required until t-butylphosphine was detected in the sampled gas was measured using cobalt chloride (coloring component) supported on silica gel as an indicator (lower limit of detection: 10 ppm). From the measured value, the removed amount (liter at 20° C. under ordinary pressure) of t-butylphosphine per liter of the cleaning agent was calculated as a measure of the cleaning efficiency. The results are shown in Table 1.

EXAMPLES 2 and 3

The same cleaning test as in Example 1 was repeated except for changing the concentration of t-butylphosphine to 500 ppm (Example 2) and 10,000 ppm (Example 3). The results are shown in Table 1.

EXAMPLES 4 and 5

The same procedure for preparing the cleaning agent (A) as in Example 1 was repeated except for using a powdery copper (II) oxide having a BET specific surface area of 50 m²/g (Example 4) or 15 m²/g (Example 5), thereby obtaining cleaning agents (B) and (C), respectively. The moisture contents of the cleaning agents (B) and (C) were both within the range of 0.5 to 1.5% by weight.

The same cleaning test as in Example 1 was repeated using the cleaning agents (B) and (C). The results are shown in Table 1.

EXAMPLES 6 to 8

The same cleaning tests as in Examples 1, 4 and 5 were repeated except for using t-butylarsine as the harmful component instead of t-butylphosphine. The results are shown in Table 1.

EXAMPLES 9 to 16

The same cleaning test as in Example 1 was repeated except for using various harmful components as shown in Table 1 instead of t-butylphosphine. The results are shown in Table 1. The harmful components other than isobutylphosphine and isobutylarsine were detected by an indicator (lower limit of detection: 10 ppm) comprising silica gel supporting gold chloride and a copper salt as the coloring component.

COMPARATIVE EXAMPLES 1 and 2

The same procedure for preparing the cleaning agent (A) as in Example 1 was repeated except for using a commercially available powdery copper (II) oxide having a BET specific surface area of 5 m²/g (Comparative Example 1) or 1 m²/g (Comparative Example 2), thereby obtaining cleaning agents (a) and (b), respectively. The moisture contents of the cleaning agents (a) and (b) were both within the range of 0.5 to 1.5% by weight.

The same cleaning test as in Example 1 was repeated using the cleaning agents (a) and (b). The results are shown in Table 1.

COMPARATIVE EXAMPLES 3 and 4

The same cleaning tests as in Comparative Examples 1 and 2 were repeated except for using t-butylarsine as the harmful component instead of t-butylphosphine. The results are shown in Table 1.

TABLE 1

| | Specific surface area of CuO (m²/g) | Harmful component | Concentration (ppm) | Cleaning efficiency (liter/liter of agent) |
|---|---|---|---|---|
| Example 1 | 80 | t-BuPH₂ | 3,000 | 16 |
| Example 2 | 80 | t-BuPH₂ | 500 | 10 |
| Example 3 | 80 | t-BuPH₂ | 10,000 | 20 |
| Example 4 | 50 | t-BuPH₂ | 3,000 | 13 |
| Example 5 | 15 | t-BuPH₂ | 3,000 | 7 |
| Example 6 | 80 | t-BuAsH₂ | 3,000 | 15 |
| Example 7 | 50 | t-BuAsH₂ | 3,000 | 12 |
| Example 8 | 15 | t-BuAsH₂ | 3,000 | 6 |
| Example 9 | 80 | t-BuSH | 3,000 | 25 |
| Example 10 | 80 | t-BuSeH | 3,000 | 15 |
| Example 11 | 80 | t-BuTeH | 3,000 | 17 |
| Example 12 | 80 | i-PrPH₂ | 3,000 | 13 |
| Example 13 | 80 | i-PrAsH₂ | 3,000 | 13 |
| Example 14 | 80 | i-PrSH | 3,000 | 14 |
| Example 15 | 80 | i-PrSeH | 3,000 | 11 |
| Example 16 | 80 | i-PrTeH | 3,000 | 12 |
| Comparative Example 1 | 5 | t-BuPH₂ | 3,000 | 2 |
| Comparative Example 2 | 1 | t-BuPH₂ | 3,000 | 1 |
| Comparative Example 3 | 5 | t-BuAsH₂ | 3,000 | 2 |

TABLE 1-continued

| | Specific surface area of CuO (m²/g) | Harmful component | Concentration (ppm) | Cleaning efficiency (liter/liter of agent) |
|---|---|---|---|---|
| Comparative Example 4 | 1 | t-BuAsH$_2$ | 3,000 | 1 |

EXAMPLE 17

A mixture of 100 g of a powdery copper (II) oxide having a BET specific surface area of 80 m²/g and 10 g of a powdery manganese dioxide having a BET specific surface area of 243 m²/g (weight ratio of copper (II) oxide to manganese dioxide: 1:0.1) was uniformly kneaded with 0.55 g of hydroxypropylmethylcellulose as a binder to form a cake, which was then extruded from an extrusion molding machine into a strand having a diameter of 1.8 mm. The strand was cut into pellets each having a length of about 5 to 10 mm, and then dried at 90° C. for 12 hours to obtain a cleaning agent (D) having a moisture content of 1.0 wt. %.

The cleaning agent (D) (100 ml) was packed in a quartz cleaning column having an inner diameter of 20 mm, through which a dry nitrogen gas containing 3,000 ppm of t-butylphosphine was passed at 20° C. and a flow rate of 349 ml/min (superficial linear velocity of 1.85 cm/sec) under ordinary pressure. A portion of the effluent gas from the outlet of the cleaning column was sampled, and the time (effective treating time) required until t-butylphosphine was detected in the sampled gas was measured using cobalt chloride (coloring component) supported on silica gel as an indicator (lower limit of detection: 10 ppm). From the measured value, the removed amount (liter at 20° C. under ordinary pressure) of t-butylphosphine per liter of the cleaning agent was calculated as a measure of the cleaning efficiency. The results are shown in Table 2.

EXAMPLES 18 and 19

The same cleaning test as in Example 17 was repeated except for changing the concentration of t-butylphosphine to 500 ppm (Example 18) and 10,000 ppm (Example 19). The results are shown in Table 2.

EXAMPLES 20 and 21

The same procedure for preparing the cleaning agent (D) as in Example 17 was repeated except for changing the weight ratio of copper (II) oxide to manganese dioxide to 1:0.05 (Example 20) or 1:0.2 (Example 21), thereby obtaining cleaning agents (E) and (F), respectively. The moisture contents of the cleaning agents (E) and (F) were both within the range of 0.5 to 1.5% by weight.

The same cleaning test as in Example 17 was repeated using the cleaning agents (E) and (F). The results are shown in Table 2.

EXAMPLES 22 and 23

The same procedure for preparing the cleaning agent (D) as in Example 17 was repeated except for using a powdery manganese dioxide having a BET specific surface area of 182 m²/g (Example 22) or 138 m²/g (Example 23), thereby obtaining cleaning agents (G) and (H), respectively. The moisture contents of the cleaning agents (G) and (H) were both within the range of 0.5 to 1.5% by weight.

The same cleaning test as in Example 17 was repeated using the cleaning agents (G) and (H). The results are shown in Table 2.

EXAMPLE 24

The same procedure for preparing the cleaning agent (D) as in Example 17 was repeated except for using a powdery copper (II) oxide having a BET specific surface area of 50 m²/g, thereby obtaining a cleaning agent (I). The moisture content of the cleaning agent (I) was 0.9% by weight.

The same cleaning test as in Example 17 was repeated using the cleaning agent (I). The results are shown in Table 2.

EXAMPLE 25

The same procedure for preparing the cleaning agent (D) as in Example 17 was repeated except for using a powdery copper (II) oxide having a BET specific surface area of 50 m²/g and a powdery manganese dioxide having a BET specific surface area of 182 m²/g, thereby obtaining a cleaning agent (J). The moisture content of the cleaning agent (J) was 0.8% by weight.

The same cleaning test as in Example 17 was repeated using the cleaning agent (J). The results are shown in Table 2.

EXAMPLE 26

The same procedure for preparing the cleaning agent (D) as in Example 17 was repeated except for using a powdery copper (II) oxide having a BET specific surface area of 15 m²/g, thereby obtaining a cleaning agent (K). The moisture content of the cleaning agent (K) was 1.0% by weight.

The same cleaning test as in Example 17 was repeated using the cleaning agent (K). The results are shown in Table 2.

EXAMPLE 27

The same procedure for preparing the cleaning agent (D) as in Example 17 was repeated except for using a powdery copper (II) oxide having a BET specific surface area of 15 m²/g and a powdery manganese dioxide having a BET specific surface area of 182 m²/g, thereby obtaining a cleaning agent (L). The moisture content of the cleaning agent (L) was 0.9% by weight.

The same cleaning test as in Example 17 was repeated using the cleaning agent (L). The results are shown in Table 2.

EXAMPLES 28 to 36

The same cleaning test as in Example 17 was repeated except for using various harmful components as shown in Table 2 instead of t-butylphosphine. The results are shown in Table 2. The harmful components other than isobutylphosphine and isobutylarsine were detected by an indicator (lower limit of detection: 10 ppm) comprising silica gel supporting gold chloride and a copper salt as the coloring component.

COMPARATIVE EXAMPLES 5 and 6

The same procedure for preparing the cleaning agent (D) as in Example 17 was repeated except for using a powdery copper (II) oxide having a BET specific surface area of 5 m²/g (Comparative Example 5) or 1 m²/g (Comparative Example 6), thereby obtaining cleaning agents (c) and (d), respectively. The moisture contents of the cleaning agents (c) and (d) were both in the range of 0.5 to 1.5% by weight.

The same cleaning test as in Example 17 was conducted using the cleaning agents (c) and (d). The results are shown in Table 2.

TABLE 2

| | Specific surface area of CuO [m²/g] | Specific surface area of MnO₂ [m²/g] | Weight ratio (MnO₂/CuO) |
|---|---|---|---|
| Example 17 | 80 | 243 | 0.1 |
| Example 18 | 80 | 243 | 0.1 |
| Example 19 | 80 | 243 | 0.1 |
| Example 20 | 80 | 243 | 0.05 |
| Example 21 | 80 | 243 | 0.2 |
| Example 22 | 80 | 182 | 0.1 |
| Example 23 | 80 | 138 | 0.1 |
| Example 24 | 50 | 243 | 0.1 |
| Example 25 | 50 | 182 | 0.1 |
| Example 26 | 15 | 243 | 0.1 |
| Example 27 | 15 | 182 | 0.1 |
| Example 28 | 80 | 243 | 0.1 |
| Example 29 | 80 | 243 | 0.1 |
| Example 30 | 80 | 243 | 0.1 |
| Example 31 | 80 | 243 | 0.1 |
| Example 32 | 80 | 243 | 0.1 |
| Example 33 | 80 | 243 | 0.1 |
| Example 34 | 80 | 243 | 0.1 |
| Example 35 | 80 | 243 | 0.1 |
| Example 36 | 80 | 243 | 0.1 |
| Comparative Example 5 | 5 | 243 | 0.1 |
| Comparative Example 6 | 1 | 243 | 0.1 |

| | Harmful component | Concentration (ppm) | Cleaning efficiency (liter/liter of agent) |
|---|---|---|---|
| Example 17 | t-BuPH₂ | 3,000 | 20 |
| Example 18 | t-BuPH₂ | 500 | 17 |
| Example 19 | t-BuPH₂ | 10,000 | 25 |
| Example 20 | t-BuPH₂ | 3,000 | 18 |
| Example 21 | t-BuPH₂ | 3,000 | 19 |
| Example 22 | t-BuPH₂ | 3,000 | 18 |
| Example 23 | t-BuPH₂ | 3,000 | 15 |
| Example 24 | t-BuPH₂ | 3,000 | 16 |
| Example 25 | t-BuPH₂ | 3,000 | 13 |
| Example 26 | t-BuPH₂ | 3,000 | 10 |
| Example 27 | t-BuPH₂ | 3,000 | 9 |
| Example 28 | t-BuAsH₂ | 3,000 | 20 |
| Example 29 | t-BuSH | 3,000 | 30 |
| Example 30 | t-BuSeH | 3,000 | 18 |
| Example 31 | t-BuTeH | 3,000 | 20 |
| Example 32 | i-PrPH₂ | 3,000 | 15 |
| Example 33 | i-PrAsH₂ | 3,000 | 15 |
| Example 34 | i-PrSH | 3,000 | 20 |
| Example 35 | i-PrSeH | 3,000 | 13 |
| Example 36 | i-PrTeH | 3,000 | 15 |
| Comparative Example 5 | t-BuPH₂ | 3,000 | 6 |
| Comparative Example 6 | t-BuPH₂ | 3,000 | 5 |

(D) Desorption Test after Cleaning Treatment

In the cleaning tests of Examples 1 to 36, the flow of the harmful gas was stopped at the time the harmful component was detected in the sampled gas, and then only a dry nitrogen gas was passed through the cleaning column for 24 hours. During the passage of the dry nitrogen gas, no harmful component desorbed from the cleaning agent was detected in the effluent gas from the cleaning column. This indicates that the cleaning agents A to L of the present invention strongly and stably adsorbed the harmful components.

As described above, in accordance with the cleaning agent and the cleaning process of the present invention, a harmful gas containing a harmful organometallic compound represented by the general formula:

$$R_m\text{—}M\text{—}H_n$$

wherein R, M, m and n are as defined above, is cleansed in a high cleaning efficiency without desorption of the adsorbed harmful components.

What is claimed is:

1. A cleaning agent for cleaning a harmful gas containing, as a harmful component, an organometallic compound represented by the general formula:

$$R_m\text{—}M\text{—}H_n$$

wherein R is alkyl; M is As, P, S, Se or Te; and m and n are each positive integer satisfying the relation: m+n=valence of M, the cleaning agent comprising, as an effective component, copper (II) oxide having a BET specific surface area of 10 m²/g or greater.

2. A cleaning agent for cleaning a harmful gas containing, as a harmful component, an organometallic compound represented by the general formula:

$$R_m\text{—}M\text{—}H_n$$

wherein R is alkyl; M is As, P, S, Se or Te; and m and n are each positive integer satisfying the relation: m+n=valence of M, the cleaning agent comprising, as effective components, 0.3 part by weight or less of manganese dioxide having a BET specific surface area of 130 m²/g or greater per 1 part by weight of copper (II) oxide having a BET specific surface area of 10 m²/g or greater.

3. The cleaning agent according to claim 1, further comprising a binder.

4. The cleaning agent according to claim 2, further comprising a binder.

5. The cleaning agent according to claim 3, wherein the binder is at least one compound selected from the group consisting of polyvinyl alcohol, polyethylene glycol, polypropylene glycol, methylcellulose, hydroxypropylmethylcellulose, carboxymethylcellulose, silica, alumina, diatomaceous earth, sodium silicate and sodium hydrogensulfate.

6. The cleaning agent according to claim 4, wherein the binder is at least one compound selected from the group consisting of polyvinyl alcohol, polyethylene glycol, polypropylene glycol, methylcellulose, hydroxypropylmethylcellulose, carboxymethylcellulose, silica, alumina, diatomaceous earth, sodium silicate and sodium hydrogensulfate.

7. The cleaning agent according to claim 1, wherein the content of the effective component is 75% by weight or greater based of the total weight of the cleaning agent.

8. The cleaning agent according to claim 2, wherein the content of the effective components is 75% by weight or greater based of the total weight of the cleaning agent.

9. The cleaning agent according to claim 1, wherein the alkyl of the organometallic compound is t-butyl or isopropyl.

10. The cleaning agent according to claim 2, wherein the alkyl of the organometallic compound is t-butyl or isopropyl.

11. A process for cleaning a harmful gas containing, as a harmful component, an organometallic compound represented by the general formula:

$$R_m\text{—}M\text{—}H_n$$

wherein R is alkyl; M is As, P, S, Se or Te; and m and n are each positive integer satisfying the relation: m+n=valence of M, the process comprising:

contacting the harmful gas with a cleaning agent comprising, as an effective component, copper (II) oxide having a BET specific surface area of 10 m²/g or greater.

12. A process for cleaning a harmful gas containing, as a harmful component, an organometallic compound represented by the general formula:

$$R_m\text{—}M\text{—}H_n$$

wherein R is alkyl; M is As, P, S, Se or Te; and m and n are each positive integer satisfying the relation: m+n=valence of M, the process comprising:

contacting the harmful gas with a cleaning agent comprising, as effective components, 0.3 part by weight or less of manganese dioxide having a BET specific surface area of 130 m$^2$/g or greater per 1 part by weight of copper (II) oxide having a BET specific surface area of 10 m$^2$/g or greater.

13. The process according to claim 11, wherein the alkyl of the organometallic compound is t-butyl or isopropyl.

14. The process according to claim 12, wherein the alkyl of the organometallic compound is t-butyl or isopropyl.

* * * * *